(12) United States Patent
Park

(10) Patent No.: US 7,582,508 B2
(45) Date of Patent: Sep. 1, 2009

(54) METHOD FOR MANUFACTURING AN ORGANIC SEMICONDUCTOR DEVICE THAT UTILIZES IONIC SALT

(76) Inventor: Byoung-Choo Park, Yeongtong Village 102-202, 917, Yeongdeok-dong, Giheung-gu, Yongin-si, Gyeonggi-do (KR)

( * ) Notice: Subject to any disclaimer, the term of this patent is extended or adjusted under 35 U.S.C. 154(b) by 378 days.

(21) Appl. No.: 11/443,625

(22) Filed: May 31, 2006

(65) Prior Publication Data
US 2007/0281386 A1    Dec. 6, 2007

(51) Int. Cl.
*H01L 51/40*    (2006.01)
*H01L 51/56*    (2006.01)

(52) U.S. Cl. .............. 438/99; 438/466; 257/E51.018; 427/544

(58) Field of Classification Search .......... 257/E51.018, 257/E51.022
See application file for complete search history.

(56) References Cited

U.S. PATENT DOCUMENTS

| 2004/0170863 | A1* | 9/2004 | Kim et al. ................ | 428/690 |
| 2005/0014026 | A1 | 1/2005 | Park ........................... | 428/690 |

FOREIGN PATENT DOCUMENTS

| JP | 03-000790 | 1/1991 |
| JP | 03-171590 | 7/1991 |

OTHER PUBLICATIONS

D.B Romero et al. "Effects of doping in polymer light-emitting diodes" American Institute of Physics, 1995, pp. 1659-1661.

T.R. Hebner et al. "Local tuning of organic light-emitting diode color by dye droplet application" American Institute of Physics, 1998, pp. 1775-1777.

C.W. Tang et al. "Organic electroluminescent diodes" American Institute of Physics, 1987, pp. 913-915.

C.W. Tang et al. "Electroluminescence of dopes organic thin films" American Institute of Physics, 1989, pp. 3610-3616.

Yang Yang et al. "Efficient blue-green and white light-emitting electrochemical cells based on poly [9,9-bis(3,6-dioxaheptyl)-fluorene-2,7-diyl]" American Institute of Physics, 1997, pp. 3294-3298.

(Continued)

*Primary Examiner*—Stephen W Smoot
(74) *Attorney, Agent, or Firm*—Park & Associates IP Law LLC

(57) ABSTRACT

A method for manufacturing an organic semiconductor device having enhanced uniformity of light-emission and excellent luminance with relatively low driving voltage by a wet process is disclosed. The method for manufacturing an organic semiconductor device, comprises the steps of: forming a first electrode on a substrate; forming an organic semiconductor layer including an ionic salt by coating an organic compound solution on the first electrode and removing an organic solvent from the coated organic compound solution, wherein the organic compound solution includes the organic solvent, the ionic salt and organic semiconductor compounds; forming a second electrode having the opposite electric potential to the first electrode on the organic semiconductor layer including the ionic salt; and treating the organic semiconductor layer including the ionic salt with thermal annealing and electrical annealing simultaneously.

18 Claims, 3 Drawing Sheets

OTHER PUBLICATIONS

H. Aziz et al. "Electric-Field-Induced Degradation of Poly (p-phenylenevinylene) Electroluminescent Devices" American Chemical Society, 1997, pp. 4009-4012.

Dongge Ma et al. Improvement of luminescence efficiency by electrical annealing in a single-layer organic light-emitting diodes based on conjugated dendrimer Institute of Physics Publishing, 2002, pp. 520-523.

Chihaya Adachi et al. "Electroluminescence in Organic Films with Three-Layer Structure" Japanese Journal of Applied Physics, 1998, pp. 269-271.

J.H. Burroughes "Light-emitting diodes based on conjugated polymers" Nature Publishing Group, 1990, pp. 539-541.

S. Miyata et al. "Novel organic EL devices" Elsevier Science B.V., 2002, pp. 99-107.

A.G. MacDiarmid et al. "Role of ionic species in determining characteristics of polymer LEDs" Elsevier Science S.A., 1999, pp. 1026-1029.

Y. Sakuratani et al. "Enhanced electron injection and electroluminescence in poly (N-vinyl carbazole) film doped with ammonium salt" Elsevier Science B.V., 2001, pp. 207-210.

Yuhki Sakuratani et al. "All-wet fabrication of an organic electroluminescent device" Elsevier Science B.V., 2001, pp. 256-259.

* cited by examiner

METHOD FOR MANUFACTURING AN ORGANIC SEMICONDUCTOR DEVICE THAT UTILIZES IONIC SALT

FIELD OF THE INVENTION

The present invention relates to a method for manufacturing an organic semiconductor device that utilizes ionic salts, and more particularly to, a method for manufacturing an organic semiconductor device having enhanced uniformity of light-emission and excellent luminance with relatively low driving.

BACKGROUND OF THE INVENTION

Generally, organic semiconductor devices including organic diode devices and organic transistor devices are based on the electrical semi-conductivity that relates to the HOMO (highest occupied molecular orbital) energy level and the LUMO (lowest unoccupied molecular orbital) energy level of organic materials. Examples of the organic diode devices include organic light emitting diodes and organic EL (Electroluminescent) diodes, and examples of the organic transistor devices include organic FETs (Field Effect Transistors), organic TFTs (Thin Film Transistors), organic SITs (Static Induction Transistors), organic top gate SIT, organic triodes, organic grid transistors, organic thyristors, and organic bipolar transistors. In these organic semiconductor devices having the organic layers, the electrical and optical characteristics of the devices are strongly dependent on the thin film structure of the organic layers formed on a substrate. Thus, the development of the thin film having an efficient structure is technically as important as the development of new organic materials.

Hereinafter, the structure and the operation of the organic semiconductor device will be described with reference to an organic EL device. The organic EL device which is generally referred to as 'organic EL' is one of the self light-emission display devices. In the organic EL devices, the thin film containing fluorescent organic compounds is positioned between electrodes, cathode and anode. The organic EL devices using low or high molecular weight organic compounds as light-emitting materials have many advantages over the EL devices using inorganic compounds as light-emitting materials. These advantages include a simple fabrication, a low driving voltage, and an easy manufacture of large size display and full color display. In the organic EL devices, electrons and holes are injected into the LUMO and HOMO levels of the fluorescent organic compounds of the thin film from the cathode and anode having the opposite electric potential to the cathode, and the injected electrons and holes are recombined to produce excitons, which emit light (fluorescence or phosphorescence) through losing their activity.

FIG. 1a is a structure diagram for illustrating the conventional organic EL device. As shown in FIG. 1a, in the conventional organic EL device, the organic EL layers 20 are positioned between electrodes 11 and 17. The organic EL layers 20 have a multi-layered structure, in which the interface of each layer in the organic EL layers 20 is clearly distinguished. The representative example of the multi-layered structure includes a hole transporting layer 13, a light emitting layer 14 and an electron transporting layer 15 (see: Tang et al., Appl. Phys. Lett. 1987, 51, 913-915). And at need, the multi-layered structure further comprises a hole injecting layer 12 and/or an electron injecting layer 16. When a voltage is applied to the organic EL layers 20 from the electrodes 11 and 17, the electron-hole are recombined at the light-emitting layer 14 of the organic EL layers 20 to induce the light-emission. After fabricating the organic EL device, in order to prevent the organic EL device from being deteriorated due to the exterior air, the substrate (EL panel) on which the organic EL device has been formed is encapsulated with sealing materials (packaging), and is bonded to a cover member. Then, the connectors (FPC, TAB, etc.) are mounted for connecting the encapsulated EL device to an external driving circuit, which produces a passive or active matrix light-emitting device. Such the multi-layered structure has been adopted in almost all kinds of EL devices. For example, Tang et al., produced the organic EL layers of multi-layered structure by sequentially forming a transparent electrode (anode) having high work function, a hole transporting layer, a light-emitting layer with an electron transporting efficiency and a metal electrode (cathode) having low work function. The organic EL devices adopting the above-mentioned organic EL layers have shown luminance of 1,000 $cd/m^2$ with the applied voltage of 10V or below. That is, the organic EL devices suggested by Tang et al. have a low voltage operation and a high light-emitting efficiency. In the above-mentioned organic EL devices, tris(8-quinolinolate)aluminium complex (Alq3) was used as light-emitting materials and Alq3 is known to a good light-emitting materials having a high light-emitting efficiency and electron transporting efficiency.

Another organic EL device with the multi-layered structure has the three-layered structure where a light-emitting layer is formed between a hole transporting layer and an electron transporting layer (see: Jpn. J. Appl Phys. 27 (1988) L269). And still another organic EL device has a light-emitting layer in which the dye (fluorescence pigment such as coumarine derivatives, DCM1 etc.) is doped, thereby controlling light-emitting color thereof and increasing the light-emitting intensity thereof (see: J. Appl Phys., 65 (1989) 3610). Besides the monomeric low molecular weight EL materials, conjugated polymers such as poly(phenylvinylene) were introduced as the EL materials in 1990 by Burroughes et al. (Burroughes, J. H. Nature 1990. 347. 539-541). Recently, stability, efficiency and durability of the polymer EL materials have been remarkably improved.

The organic EL layers 20 can be formed by various methods. Exemplary methods include dry processes such as a vacuum evaporation and a sputtering, and wet processes such as a spin coating method, a cast method, an ink-jet method, a dipping method, and a printing method. Besides, a roll coating method, an Langmuir-Blodgett method and an ion plating method can also be used. The dry process such as a vacuum evaporation has been generally used to manufacture the multi-layered EL device shown in FIG. 1a by using a low molecular weight compound having a good thermal stability and capable of being sublimated to form a thin film. However the dry process requires a high vacuum environment, the manufacturing conditions should be controlled carefully, and thus the process for fabricating EL devices is complex, resulting in the large manufacturing costs. The wet process comprises the steps of dissolving materials which are used for a hole transporting layer, an electron transporting layer and/or a light-emitting layer and a binder resin with a suitable solvent, forming organic layers by spreading the dissolved solution on the surface of the electrode and then evaporating the solvent, and forming an opposite electrode with a method such as evaporation.

The wet process has the following advantages in comparison with the dry process. (1) The wet process can use materials which are difficult to form the film with the dry processes such as vacuum evaporation etc. and use a high molecular weight organic EL materials as well as to a low molecular weight organic EL materials so that it is possible to form a film variously. (2) It is easy to control a very small amount of dopant, which is difficult in the dry process. (3) The manufacture of large size display can be easily carried out. (4) The organic EL layer of the organic EL device can be easily formed relatively and thus the manufacturing cost of the organic EL device is relatively low. (5) Lights with different wavelength can be emitted from each of light-emitting materials at the same time by using various light-emitting materials, so that for example, white light-emission can be easily carried out. (6) Materials of each layer of a conventional EL device are in amorphous state, however, materials of organic layer of the polymer distribution type EL device are distributed in a binder resin and thus the polymer distribution type EL device has a good thermal stability.

The exemplary methods for forming light-emission area with a wet process were disclosed in Japanese Patent Unexamined Publication No. H03-000790 and Japanese Patent Unexamined Publication No. H03-171590. In Japanese Patent Unexamined Publication No. H03-000790 pellinon derivatives or Alq as light-emitting materials are distributed in poly N-vinylcarbazole(PVK), and in Japanese Patent Unexamined Publication No. H03-171590 Alq and tetraphenyl-bendizine as light-emitting materials are distributed in polycarbonate. In the devices having the above-mentioned light-emission area, light-emitting compounds are distributed uniformly throughout the whole light-emission area. Therefore, it is difficult to balance injection and transportation of holes and electrons. As a result, a recombination possibility is decreased and then it is difficult to get sufficient light-emitting efficiency. At need, the organic EL layers of light-emission area can be formed by using the combination of the wet process and the dry process. However, the device having the organic EL layer produced with this method also has a low light-emitting efficiency and requires a high driving voltage.

As one of the solutions to overcome these disadvantages, the method of doping the organic EL layer with ionic salt can be considered. It was reported that the light-emitting intensity is increased when a bias voltage is applied to a light-emitting electrochemical cell for a given time (electrical annealing). Wherein the light-emitting electrochemical cell is manufactured by doping the mixture of polymer such as PPV and ionic conductive materials such as poly(ethylene-oxide)(PEO) with salts such as $LiCF_3SO_3$ (see: Y. Yang and Q. Pei, J. Appl. Phys. vol (81), page 3294, 1997). Further, the similar phenomenon to the electrical annealing observed at the high molecular weight EL device which was doped with ions (see: D. B. Romero et al., Appl Phys. Lett. vol(67) page 1659 1995, A. G. MacDiamid and F. Huang, Synth. Met. vol(102) page 1026, 1999). Also, it was reported that the characteristics of the high molecular weight EL device can be improved by ions which was introduced unexpectedly during the synthesis (see: H. Aziz and G. Xu, J. Phys. Chem. B vol(101) page 4009, 1997).

The effects of the above-mentioned ion doping can be explained with the rearrangement of ions doped in the organic layer by the electric field. Namely, when the voltage is applied to the organic EL layers sandwiched between the electrodes, ions doped in the organic EL layers are stacked at the vicinity of the electrodes to form a space charge, thus the light-emitting efficiency of the EL device is increased and the operation voltage of the EL device is decreased.

Specifically, in case of existing ions in the thin layer of high molecular weight compound, ion polarization is induced by migrating anions toward the anode and the cations toward the cathode in the electrical annealing process. The migration of ions produces space charges at the electrodes vicinity. In case that these space charges are stacked at the electrodes vicinity, a large electric field is produced at the electrodes vicinity. The electric field decreases the energy barrier to inject the charge carriers easily. Therefore, the bipolar recombination is increased and the EL device efficiency is enhanced because the injection possibility of holes and electrons is increased greatly.

Also, It was reported that in the case of the dendrimer EL device, the on-set voltage is decreased by changing the charge injection barrier at the boundary of electrode or the light-emitting layer (see: D. Ma et al., J. Phys. D, vol(35) page 520, 2002). And it was reported that when the electrical annealing is carried out by applying electrical voltage of 20V or more to the single light-emitting layer of the PVK, which is doped with an organic low molecule and ammonium salt(tetra-n-butylammonium tetrafluoroborate, $Bu_4NBF_4$), the reaction of $PVK+BF_4^- \to PVK+BF_4+e^-$ generates at the electrodes vicinity so that the charges are easily injected (see: Y. Sakuratani, T. Watanabe, S. Miyata; Thin Solid Films V388 (2001) 256-259; Y. Sakuratani, M. Asai, M. Tokita, S. Miyata; Synthetic Metals V123 (2001) 207-210; S. Miyata, Y. Sakuratani, X. T. Tao; Optical Materials 21 (2002) 99-107). However the maximum luminance of the EL device which was fabricated according to the above mentioned method, is about 1000 $cd/m^2$ (at ~17 V), which is not sufficient luminance. Also, the above-mentioned EL device has other disadvantages including the electrical damage and the deterioration of the uniformity of the light-emission because the electrical annealing voltage is comparatively high (>20 V). These disadvantages result from the uneven charge injection at the light-emitting surface (pixel area). In detail, in the electrical-annealing process, the EL device was heated by Joule heating produced from the current flowing through the device. The temperature of the center of the pixel area is relatively higher than that of the edges of the pixel area due to the low thermal conductivity between the EL device and the substrate on which the EL device is formed. Therefore, ions at the center of the EL device having relatively high temperature migrate easily toward the electrodes. On the other hands, ions at the edges of the EL device having relatively low temperature do not easily migrate toward the electrodes comparatively. Thus, ions are not uniformly spread over the whole electrodes and the uniform charge injection cannot be achieved. As a result, the uniformity of the light-emitting surface is decreased. If the additional electrical annealing will be performed so as to raise the temperature of the edges of the pixel area, ions at the edges of the EL device may easily migrate toward the electrodes and high light-emitting characteristics may be obtained. However, the additional electrical annealing creates the over flowing of current at the center of the EL device so that the EL device is deteriorated and finally the uniformity of the light-emission of EL device is further decreased.

SUMMARY OF THE INVENTION

An object of the present invention is to provide a method for manufacturing an organic semiconductor device including the organic EL device capable of solving the foregoing disadvantages from the conventional wet process.

Another object of the present invention is to provide a method for manufacturing an organic semiconductor device having a good uniformity of the light-emission, an excellent luminance and a good light-emitting efficiency.

Yet another object of the present invention is to provide a method for manufacturing an organic semiconductor device having a low driving voltage, an improved quality of display images and an improved operation reliability.

Yet another object of the present invention is to provide a method for manufacturing an organic semiconductor device which can be easily manufactured with economical cost.

In order to achieve theses objects according to one aspect of the invention, it is provided a method for manufacturing an organic semiconductor device, comprising the steps of: forming a first electrode on a substrate; forming an organic semiconductor layer including an ionic salt by coating an organic compound solution on the first electrode and removing an organic solvent from the coated organic compound solution, wherein the organic compound solution includes the organic solvent, the ionic salt and organic semiconductor compounds; forming a second electrode having the opposite electric potential to the first electrode on the organic semiconductor layer including the ionic salt; and treating the organic semiconductor layer including the ionic salt with thermal annealing and electrical annealing simultaneously, Here, the organic solvent can be comprised of a single solvent. Further, the organic solvent can be the mixture of at least two solvents having different volatility and the organic semiconductor compound can be comprised of at least two organic compounds having different electrical and/or optical characteristics.

DETAILED DESCRIPTION OF THE INVENTION

Figure 1A:
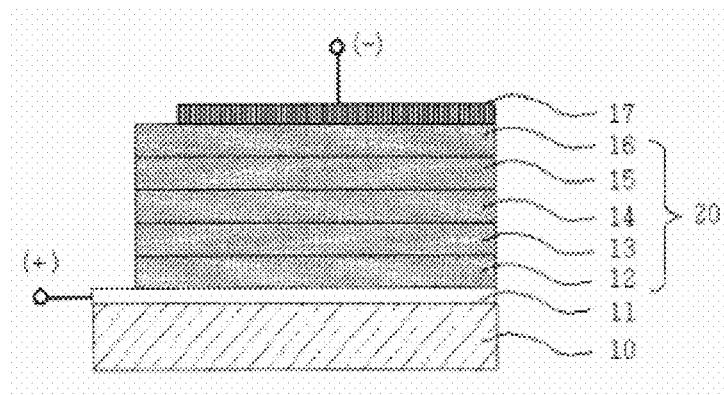
FIG. 1a is a structure diagram for illustrating the conventional organic EL device.

Hereinafter, the present invention will be described in detail with reference to the accompanying drawings. In the following description, the same reference numerals are used for the same or similar elements even in different drawings. The present invention is based on the discovery that when manufacturing the organic semiconductor device, the luminance thereof can be enhanced and the light-emission uniformity and stability thereof can be obtained by simultaneous treatments of an electrical annealing and a thermal annealing on the organic EL layer of the organic semiconductor device after forming the organic EL layer doped with the ionic salt. Therefore, the method for manufacturing an organic semiconductor device according to the present invention includes the steps of forming the organic semiconductor layer with the wet process using the organic compound solution containing the ionic salt and of treating the formed organic semiconductor layer with the electrical annealing and the thermal annealing simultaneously. The conventional methods for manufacturing an organic EL layer, for example the methods disclosed in the above-mentioned Y. Sakuratani, T. Watanabe, S. Miyata; Thin Solid Films V388 (2001) 256-259, Y. Sakuratani, M. Asai, M. Tokita, S. Miyata ; Synthetic Metals V123 (2001) 207-210, S. Miyata, Y. Sakuratani, X. T. Tao ; Optical Materials 21(2002) 99-107 and so on, disclose that high molecular weight PVK is doped with ammonium salt and then the doped PVK is treated with electrical annealing. However none of them suggested the simultaneous treatments of an electrical annealing and a thermal annealing on the organic semiconductor layer doped with ionic salts.

Figure 1B:
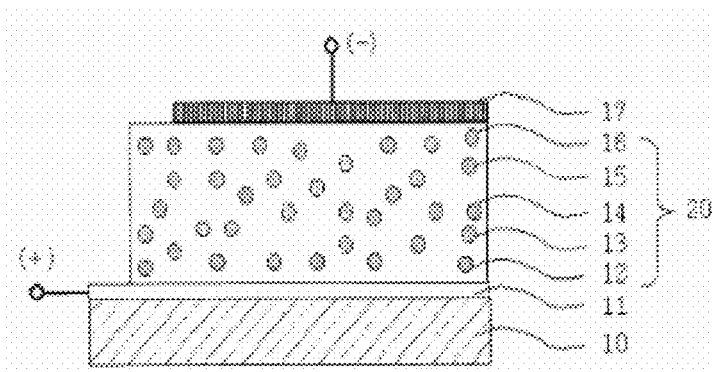
FIG. 1b is a structure diagram for illustrating the organic EL device having an organic thin film of the uniformly distributed single-layered structure.

The method for manufacturing the organic semiconductor device according to the present invention is described with reference to the EL device having the simplest structure. The method for manufacturing the organic semiconductor device according to the present invention can be applied to the semiconductor device having an organic thin film of the uniformly distributed single-layer structure as shown in FIG. 1b. In addition, this method can be applied to the semiconductor device having an organic thin film of the graded junction type single-layered structure, wherein at least two organic compounds composing the organic EL layer of the organic semiconductor device were sequentially deposited on the electrode with a concentration gradient along with the deposition direction thereof. Such a graded junction type single-layered structure was disclosed in WO 03/069959 and US Unexamined Patent Publication No. 2005-0014026, which are incorporated by reference in the present specification.

The present invention also can be applied to the stack type EL device having another layer as well as the above-mentioned graded junction type organic EL layer between the cathode and the anode. For example, it may have one of the following structures, however the present invention is not limited thereto. Here, "/" means the distinct interface, while "~" means the single-layer thin film with the graded junction type having the non-boundary interface.

(1) anode/organic layer/cathode, wherein the organic layer is the mixtures that hole injecting layer, transporting layer and light-emitting layer are distributed uniformly.

(2) anode/hole injecting and transporting layer~light-emitting layer/cathode (3) anode/light-emitting layer~electron transporting and injecting layer/cathode (4) anode/hole injecting and transporting layer~light-emitting layer~electron transporting and injecting layer/cathode (5) anode/hole injecting layer/transporting layer~light-emitting layer~electron transporting and injecting layer/cathode (6) anode/hole injecting and transporting layer~light-emitting layer~electron transporting layer/electron injecting layer/cathode Hereinafter, the organic semiconductor compound means the organic compound having the electrical and/or optical characteristics such as a hole injection or transportation, luminescence or fluorescence, electron transportation or injection and so on.

Figure 2A:
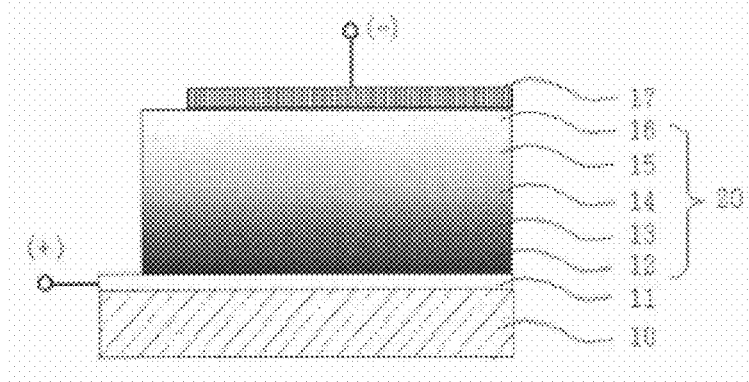
FIG. 2a is a structure diagram for illustrating the organic EL device having an organic thin film of the graded junction type single-layered structure according to one embodiment in view of one aspect of the present invention.
Figure 2B:
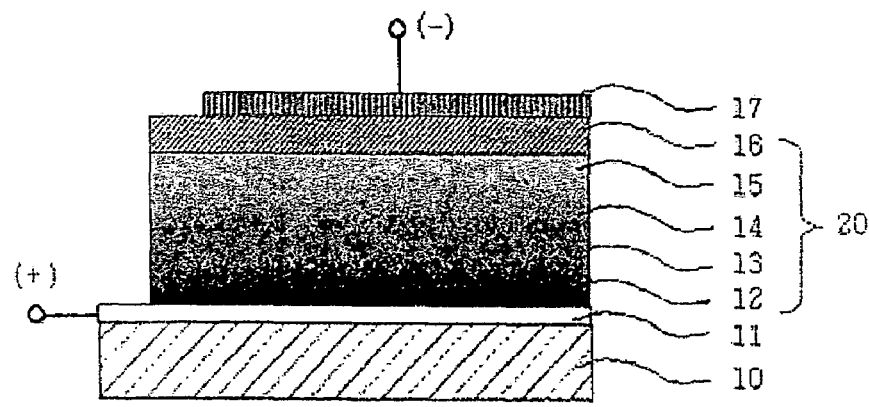
FIG. 2b is a structure diagram for illustrating the organic EL device having an organic thin film of the graded junction type single-layered structure and another organic thin film according to another embodiment in view of one aspect of the present invention.

FIG. 2a is a structure diagram for illustrating the organic EL device having an organic thin film of the graded junction type single-layered structure. As shown in FIG. 2a, at least two organic semiconductor compounds including hole injecting materials 12, hole transporting materials 13, light-emitting materials 14, electron transporting materials 15 and electron injecting materials 16 are sequentially deposited with a concentration gradient along with the deposition direction thereof to form single-layered organic EL layer 20 of the graded junction type. The organic EL layer 20 of single-layered structure is positioned between the anode 11 and the cathode 17 having the opposite electric potential to the anode 11. The organic EL device having the organic EL layer 20 of the single-layered graded junction type can be manufactured by coating a composite solution prepared by dissolving at least two organic compounds having different solubility in a mixed solvent including at least two organic solvents having different volatility, on the substrate where the electrode has been formed, and by evaporating the organic solvents from the coated composite solution to sequentially deposit the organic compounds. Further, as shown in FIG. 2b, the organic EL layer 20 sandwiched between the anode 11 and the cathode 17 may be composed of one graded junction type organic layer and another type organic layer formed by using the conventional wet process or the dry process. In detail, one organic layer of graded junction type contains hole injecting materials 12, hole transporting materials 13, light-emitting materials 14 and electron transporting materials 15 which are sequentially deposited, and the electron injecting layer 16 is manufactured with the conventional wet process or the dry process such as vacuum evaporation.

The organic compound solution used to manufacture the organic EL device according to the present invention includes the organic semiconductor compound, for example at least one organic light-emitting compounds which emit red, green or blue light. Preferably, the organic compound solution is optimized to enable the devices to display wide ranges of colors (for example, 460, 520 and 650 nm of narrow lines for B, G and R). The light-emitting materials of the organic EL device of the present invention are not limitative, and thus a variety of fluorescent materials or phosphorescent materials emitting light by hole-electron recombination as the conventional compounds for manufacturing an organic EL device, can be used in the present invention. Preferably, low molecular weight fluorescent materials or fluorescent polymer materials having the light-emitting property can be used, and the mixture of the low molecular weight materials and the high molecular weight (polymer) materials can be also used. More preferably, materials having strong fluorescent or phosphorescent property, including cyanine dye, merocyanine dye, styryl system dye, dye such as anthracene derivative, porphyrin derivative, phthalocyanine derivative, coumarin, DCM or nile red and laser dye, can be used.

In the organic EL device of the present invention, exemplary organic compounds, used as the hole injecting and the hole transporting compounds, include soluble phthalocyanine compounds, aromatic diamine compounds such as TPD ((N,N'-diphenyl-N,N'-bis(3-methylphenyl)-[1,1'-biphenyl]-4,4'-diamine: triphenylamine derivative), triphenylamine, MTDATA (4,4',4''-tris[3-methylphenyl (phenyl)amino]triphenylamine), quinacridone, bisstil anthracen derivative, 5,10,15,20-tetraphenyl-21H,23H-porphine copper, PVK(polyvinyl carbazole), porphyrinic compounds, α-NPD (N,N'-diphenyl-N,N'-bis(1-naphthylphenyl)-1,1'-biphenyl-4,4'-diamine), and conductive polymers conductive polymers such as NPB (N,N'-Bis(naphthalen-1-yl)-N,N'-bis(phenyl) benzidine), spiro-NPB, spiro-TAD, polyaniline, PEDOT/PSS (Poly(3,4-oxyethyleneoxythiophene)/poly(styrene sulfonate)) and so on, which are not intended to be limiting.

In the organic EL device of the present invention, exemplary electron injecting and electron transporting compounds, include $Alq_3$ which is an aluminum complex prepared by coordinating three hydroxyquinolines on aluminum atoms, a Zn complex such as ZnNBTZ, ZnBTZ, Zn(tOc-BTAZ), electron deficient compounds such as distyryl biphenyl derivative, dilithium phthalo cyanine, disodium phthalo cyanine, magnesium porphine, or 4,4,8,8-tetrakis(1H-pyrazole-1-yl)pyrazabole, 3-(2'-benzothiazole)-7-diethyl-aminocoumarine, BND(2,5-bis(1-naphthyl)-1,3,4-oxadiazole), PBD(2-(4-tert-butylphenyl)-5-(4-biphenylyl)-1,3,4-oxadiazole), and the hole blocking materials such as BCP(2,9-dimethyl-4,7-diphenyl-1,10-phenanthroline) and triazole derivative [example: 3,4,5-Triphenyl-1,2,4-triazole, 3-(biphenyl-4-yl)-4-phenyl-5-tert-butylphenyl-1,2,4-triazole, 3,5-bis(4-tert-butylphenyl)-4-phenyl-[1,2,4]triazole], which are not intended to be limiting.

Further, as the organic light-emitting compounds, the preferable materials have lower ionic potential than the hole transporting compounds and has higher electronic affinity than the electron transporting compounds. Exemplary low molecular weight organic compounds used as the green light-emitting materials, which emit light in a green color range (520 nm), include alumina quinine (Alq3, tris(8-hydroxyquinolato) aluminum), the modified Alq3 including tris(5-chloro-8-hydroxy-quinolinato)-aluminum, tris(4-methyl-8-hydroxyquinoline) aluminum, tris(5,7-dichloro-8-hydroxyquinolinato)-aluminum and Gaq3, BeBq2(10-benzo[h]quinolinol-beryllium complex), or the phosphorescent single-molecules such as tris(1-phenyl-3-methyl-4-(2,2-dimethylpropan-1-oyl)-pyrazolin-5-one) terbium (III). Further, typically, a few mol % of quinacridone, coumarin, coumarin 6, C545T (10-(2-benzothiazolyl)-2,3,6,7-tetrahydro-1,1,7,7-tetramethyl-1H,5H, 11H-[1]benzopyrano[6,7,8-ij]quinolizin-11-one) or Ir-complex can be added (doped) to improve light-emitting efficiency and durability of the EL device.

Also, exemplary doping materials of red light-emitting compounds include Indigo, Nile Red, DCJTI(propanedinitrile[2-(2-propyl)-6-[2-(2,3,6,7-tetrahydro-2,2,7,7-tetramethyl-1H,5H-benzo[ij]quinolizin-9-yl)ethenyl]-4H-pyran], DCM2(4-(dicyanomethylene)-2-methyl-6-(julolidin-4-yl-vinyl)-4H-pyran), DCM(4-(dicyanomethylene)-2-methyl-6-(p-dimethyl aminostyryl)-4H-pyran), DCJTB(Eastman Kodak Co.), tris(hexafluoroacetylacetonate)mono(1,10-phenanthroline)erbium(III), tris(benzoyltrifluoroacetonate) mono(1,10-phenanthroline)erbium(III), bis(3-(2-(2-pyridyl)benzothenoyl)mono-acetylacetonate iridium(III), Pt-complex, rubrene, N,N'-dimethylquinacridone, tris(di(4-bromobenzoyl)methane)mono(phenathroline)europium (III), tris(dibenzoylmethane) mono(4,7-dimethylphenathroline)europium(III), tris(1,10-phenanthrolene) ruthenium(II) chloride, 2,3,7,8,12,13,17,18-octaethyl-21H,23H-porphine platinum(II) or Ru(dpp) (tris(4,7-diphenyl-1,10-phenanthroline) ruthenium (II) chloride.

Exemplary blue light-emitting compounds include metal complexes such as ZnPBO((bis[2-(2-benzoxazolyl)phenolato]Zinc(II)), Balq (bis(2-methyl-8-quinolinolato)(para-phenyl-phenolato)aluminum) or bis-(2-methyl-8-quinolinolato)-4-(phenyl-phenolato)-aluminium-(111) or non-metal complexes such as styrylarylene derivative including DPVBi (4,4'-bis(2,2'-biphenylvinyl)-1,1'-biphenyl), oxadiazole derivative, bis-styryl anthracene derivative, bis-styrylarylene derivative including BczVBi(4,4'-bis((2-carbazole)vinylene) biphenyl), Lithium tetra(8-hydroxyquinolinato) boron, tetra (2-methyl-8-hydroxyquinolato)boron with lithium salt. Also, exemplary blue light-emitting compounds include phosphorescent single-molecules such as bis(3,5-difluoro-2-(2-pyridyl)phenyl-(2-carboxypyridyl)iridium III) or polymers such as poly[(9,9-dihexyl)fluoren-2,7-diyl]-alt-co-(9,9-di-(5-pentenyl)-fluorenyl-2,7-diyl).

The exemplary blue light-emitting dopant includes phosphorescent single-molecules such as Ir(ppy)3(tris[2-(2-pyridinyl)phenyl-C,N]iridium(III); tris(2-phenylpyridine)iridium(III)), fluorescent single-molecules such as bis(2-(2-hydroxyphenyl)-benz-1,3-thiazolato) zinc complex, perylene or coumarin 47. The light-emitting materials of the organic EL device of the present invention are not specifically limited, and thus dendrimers consisting of the aforementioned single-molecules or low molecular weight materials can be used.

In the organic EL device of the present invention, exemplary high molecular weight organic compounds, used as the light-emitting compounds, include poly(p-phenylene) [example: poly(2,5-dialkyl-1,4-phenylene), poly(p-phenylene)], poly(phenylene-vinylene) [example: poly(1,4 phenylene vinylene), poly-(2,5-dialkoxy-1,4 phenylene vinylene), poly(2,5-dialkyl-1,4 phenylene vinylene)], polyarylene, polyalkyl thiopene, poly(fluorene) [example: poly (9,9-dialkyl fluorene)], poly(thiophene) [example: poly(3-alkylthiophene)] and their derivatives, which are not intended to be limiting. When conductive polymers are used for the light-emitting materials of the organic EL device according to the present invention, conductive polymers can be a random copolymer having the characteristics of the block copolymer partially, a random, block or graft copolymer having a voluntary intermediate structure or polymer, which also are not intended to limiting the present invention.

In the organic EL device according to the present invention, the organic semiconductor compounds can form the thin film with an appropriate conductive or insulative binder resin. If necessary, the organic semiconductor compounds can include an appropriate dopant. Exemplary binder resins include poly (phenylene-vinylene)(PPV), poly-N-vinylcarbazole(PVK), polymethylmethacrylate(PMMA), polyfluorine and their derivatives, polycarbonate, polyester, polyallylate, butyral resins, polyvinylacetal, diallyphthalate resins, acrylic resins, methacrylic resins, phenol resins, epoxy resins, silicone resins, polysulfone resins or urea resins. The resins can be used alone, mixture or as a copolymer, which are not intended to be limiting. Also, electron or hole transporting compounds can be mixed in order to improve the electric charge transporting property. Also, the binder resin includes resins having ordering or liquid crystallinity as well as resins having non-ordering. In case that the binder resin has liquid crystallinity, the polarized EL light-emission can be produced. Thus, if the circular polarizer is applied to the surface of the EL device, the contrast and light-emission output thereof might be improved. The amount of the organic compounds and binder resins are dependent on the use, the constituent, the thickness, etc. of the EL layer. The amount of each compound for desired effect can be determined to the experiments.

Exemplary ionic salts which are included in the organic compound solution and are doped on the organic layer, include i) inorganic salts containing Li cation such as $LiClO_4$, $LiPF_6$, $LiBF_4$, $LiN(CF_3SO_2)_2$, or lithium trifluoromethane trisulfonate, ii) organic salts such as $TEA-BF_4$ (tetra -ethylammonium tetra-fluoroborate), $Bu_4N-BF_4$(tetra-n-butylammonium tetra-fluoroborate), or tetra alkyl, aryl or hetero aryl quaternary ammonium salts[example: tetra-n-alkylammonium toluenesulfonate, tetra-n-alkylammonium tetra-fluoroborate, tetra-n-alkyl ammonium tetra-phenylborate, tetra-n-alkyl ammonium toluenesulfonate, tetra-alkylammonium tetra-fluoroborate, tetra-n-alkyl ammonium tetraphenylborate] or iii) polymeric salt such as polystyrenesulfonate (PSS). The ionic salts can be used alone or mixtures thereof. However, the above-mentioned salts are the only examples which can be used as the ionic salts and varieties of salts consisting of cation and anion can be used in the present invention. The amount of the ionic salts is dependent on the use, the constituent, the thickness, etc. of the EL layer. The preferable amount of the ionic salt is 0.02 to 30 weight % based on 100 weight % of the organic semiconductor compounds and binder resin. If the amount of ionic salt is below 0.02 weight % of the organic semiconductor compounds and binder resin, improvement of light-emitting efficiency and the reduction effect of the on-set voltage may be insufficient. If the amount of ionic salt exceeds 30 weight % of the organic semiconductor compounds and binder resin, the operation of EL devices may be deteriorated due to the excessive ion concentration.

Exemplary solvents for forming the organic compound solution include methyl alcohol, ethyl alcohol, n-propyl alcohol, isopropyl alcohol, n-butyl alcohol, sec-butyl alcohol, tert-butyl alcohol, dimethylformamide, dimethylacetamide, ketone, acetone, diacetone alcohol, keto-alcohol, dioxane, ether, polyethylene glycol, polypropylene glycol, polyalkylene glycol, ethylene glycol, propylene glycol, butylene glycol, triethylene glycol, hexylene glycol, diethylene glycol, glycerol, ethylene glycol monomethylether, diethyleneglycol methylether, triethyleneglycol monomethylether, 2-pyrrolidone, toluene, xylene, chlorobenzene, dichlorobenzene, chloroform, dichloromethane, dichloroethane, gamma-butyl lactone, butyl cellosolve, cyclohexane, NMP(N-methyl-2-pyrrolidone), cyclohexanone, THF(tetrahydrofurane), carbon tetrachloride, tetrachloroethane, octylbenzene, dodecylbenzene, quinoline, trichlorobenzene, nitrobenzaldehyde, nitrobenzene, carbon disulfide, 2-heptanone, benzene, terpineol, butylcarbitolacetate, ion exchange water (pure water) and mixtures thereof. The above-mentioned solvents are typical examples of the solvents which can be used in the present invention, and the present invention is not limited to the listed solvents. The solvents of the present invention may be a single solvent or the mixture of at least two solvents having different volatility. In case of using the mixture of at least two solvents having different volatility, the organic semiconductor layer having the concentration gradient can be produced from the difference of volatility and solubility of each solvent.

The viscosity of the organic compound solution can be controlled by the selection of the appropriate solvent for optimizing the thickness and the light-emitting intensity of the EL layer. The preferable viscosity of the organic compound solution is less than 5000 cp. The lower limit of the viscosity is not important in the present invention, but for example more than 100 cp, more preferably more than 1000 cp. The concentration of the organic compound solution is determined so as to be suitable for the wet process, preferably from 0.005 to 30 weight %, more preferably 0.01 to 10 weight %. If the viscosity and concentration of the organic compound solution are away from the above ranges, the film formation by the wet process may not be efficiently performed.

The preferable method for preparing the organic layer with the organic compound solution is a wet process such as spin-coating method, cast method, ink-jet method, dipping method and printing method. In case that the organic layer is formed on the electrodes (cathode or anode) by a wet process, the organic layer may be easily deteriorated by the moisture and oxygen of air. In order to remove moisture and oxygen, it is preferable to manufacture the organic layer by using a wet film formation device installed in a booth filled with low reactive gases, for example rare gases or inert gases such as argon, helium and nitrogen. To form organic EL layer, organic compound solution is coated on the electrode and thereafter, the solvents to form the organic EL layer are sequentially and completely removed by thermal evaporation. In addition, the organic EL layer can be formed with polymer precursors, and then the precursors can be transformed into polymer EL materials by heating.

In case that the organic layer includes the red, green and blue light-emitting compounds, the step for forming the organic semiconductor layers emitting light (red light, blue light or green light) having different wavelength by removing the organic solvent is preferably carried out respectively. The preferable thickness of the formed EL layer 20 is 10 to 1000 nm. If the thickness of the EL layer 20 is below 10 nm, an electrical short of the EL device may happen when the voltage is applied. If the thickness of the EL layer 20 exceeds 1000 nm, high permitted voltage may be required and the light-emitting efficiency may be decreased undesirably.

After forming organic EL layer 20, cathode 17 (or anode 11) is formed on the organic EL layer 20. In general, the anode 11 is preferably made of materials having a high work function. Exemplary anode 11 materials include silver, nickel, gold, platinum, palladium, selenium, rhenium, iridium, alloys thereof, tin oxide, indium-tin-oxide(ITO), indium-zinc-oxide (IZO) and copper iodide. In addition, conductive polymers such as polyaniline, poly(3-methylthiophene), polyphenylenesulfide, polypyrrole and PEDOT/PSS can be used as materials for the anode 11. On the contrary, the cathode 17 is preferably made of materials having a low work function. Exemplary cathode materials include Al, Mg, Li, Cs, Ba, K, Be, Ca and mixtures thereof. More specifically, MgAg(Mg:Ag=10:1) electrode, MgAgAl electrode, LiAl electrode, LiFAl electrode or the stack-type electrode of Li/Al or LiF/Al can be used as a cathode. Also, as the conventional organic EL device, a protective electrode (not shown) to protect the cathode 17 from external moisture can be formed optionally, wherein the protective electrode can be formed with the materials including Al or Ag. The cathode 17 can be formed by evaporation or sputtering. In case that dilithium phthalocyanine, disodium phthalocyanine, magnesium porphine or 4,4,8,8-tetrakis(1H-pyrazole-1-yl)pyrazabole is used as the electron injecting compound 16, the cathode 17 can be formed with only metals having high work function and stability. Thus oxidation of the cathode may be suppressed and the life-span of the EL device may be improved. The substrate 10 used to produce the organic EL device according to the present invention are not limitative. Examples of the substrate 10 include a transparent substrates made of glass such as Corning 1737 or polymer film such as polyester polycarbonate, polymethylmethacrylate(PMMA) or polyethyleneterephthalate and in addition example of the substrate 10 include inorganic semiconductor substrate such as silicon, gallium arsenide, which is not intended to be limiting the present invention.

The anode 11 and the cathode 17 can be formed as a shape of rectangular stripe. When the voltage is applied to the selected anode 11 and cathode 17 in a forward direction, the voltage is applied to the light-emitting area of the intersection of both electrodes 11 and 17 to emit the light. In FIG. 2a, substrate 10, anode 11, organic EL layer 20 and cathode 17 are stacked sequentially, but the stacking order is not limited. For example, the stacking order of i) substrate/the first electrode/organic EL layer/the second electrode or ii) substrate/the second electrode/organic EL layer/the first electrode can be possible. Also, in case that only the anode 11 near the substrate 10 is transparent but the cathode is not transparent, the substrate 10 is necessarily transparent to produce light-emission toward the exterior. Also, if necessary, in order to protect the EL device including cathode 17 from external oxygen and moisture, the EL device is encapsulated with a sealing member such as glass, ceramic, plastic and metal under the inert gas atmosphere, or encapsulated with a thermosetting resin or ultraviolet ray curable resin. In addition, it is preferable to set a hygroscopic material in the encapsulated space, and the representative example of the hygroscopic material is barium oxide.

After forming cathode 17 on the organic EL layer 20 including the ionic salt, a thermal-annealing process is carried out by heating with a centigrade thermostat. The preferable thermal-annealing temperature is 35 to 200° C., more preferably is lower than the glass transition temperature of the compounds consisting of the organic EL layer 20. The thermal-annealing process is to easily migrate ions of the EL layer 20. If the thermal-annealing temperature is higher than the glass transition temperature of the compounds consisting of the organic EL layer 20, the fluidity of the organic EL layer 20 may be increased and then the stability of the organic EL layer 20 may be deteriorated. Therefore, the thermal annealing has to be carried out at the above-mentioned temperature to stabilize the thin film state.

Although the thermal-annealing time is dependent on the thermal-annealing temperature, the typical thermal-annealing time is 10 seconds to 5 minutes. If the thermal-annealing temperature or the thermal-annealing time is below the above-mentioned ranges, the thermal-annealing effect is undesirable due to insufficient heating of the device. Therefore, the salts ionized in the organic layer do not migrate sufficiently to the vicinity of the electrode. If the thermal-annealing temperature or the thermal-annealing time exceeds the above-mentioned ranges, the device may be damaged due to overheating of the device. Simultaneous treatments of electrical and thermal annealing can be carried out by applying the designated voltage to the EL layer 20 which receives thermal-annealing, wherein the designated voltage is produced from the anode 11 and the cathode 17. The preferable bias voltage of the electrical-annealing is 3 to 20 volts, and the electrical-annealing time, which may be changed according to the applied voltage, is 1 second to 5 minutes. If the electrical-annealing voltage or the electrical-annealing time is below the above-mentioned ranges, the migration of ionic salts toward the electrode side is insufficient. If the electrical-annealing voltage or the electrical-annealing time exceeds the above-mentioned ranges, the device may be deteriorated electrically due to the continuously applied bias voltage even after the termination of the ions migration. After carrying out the electrical-annealing process, the EL device is cooled to room temperature to terminate the electrical-annealing process.

Simultaneous treatments of thermal-annealing and electrical-annealing limit ion distribution of salts to the interface of the EL layer 20 and electrodes 11 and 17. Namely, ions are stacked uniformly and uniform space charges are formed at the vicinity of electrode 11 and 17 over the whole light-emitting area. As a result, the electric field by the uniform space charges is formed at the vicinity of electrodes 11 and 17. The above-mentioned electric field can decrease the energy barrier to inject charge carrier easily. Therefore, the probability of the holes and electrons injection from the electrodes 11 and 17 to the EL layer 20 is increased. As a result, bipolar recombination is increased, light-emitting efficiency of the EL device is enhanced and the operation start voltage of the EL device is reduced.

If only uniform space charges are formed by stacking ions at the electrode vicinity, the type of bias voltage used in the electrical-annealing process can include various type voltages such as a direct current type, an alternating current type, a pulse type, which is not intended to be limiting the present invention.

Figure 3A:
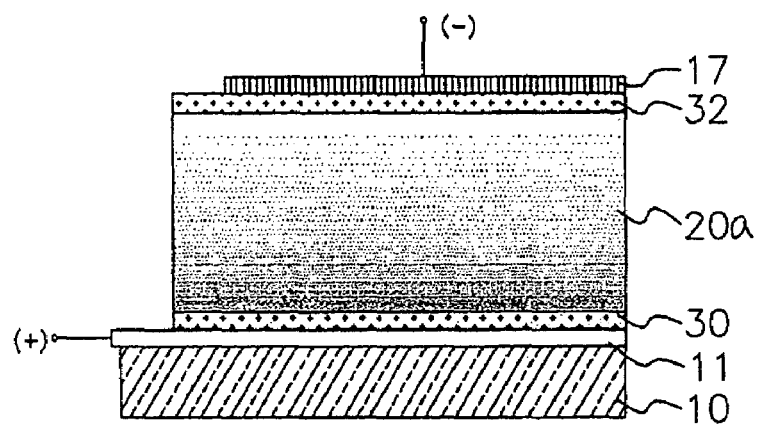
FIG. 3a is a structure diagram for illustrating the organic semiconductor device in accordance with the one embodiment in view of another aspect of the present invention.
Figure 3B:
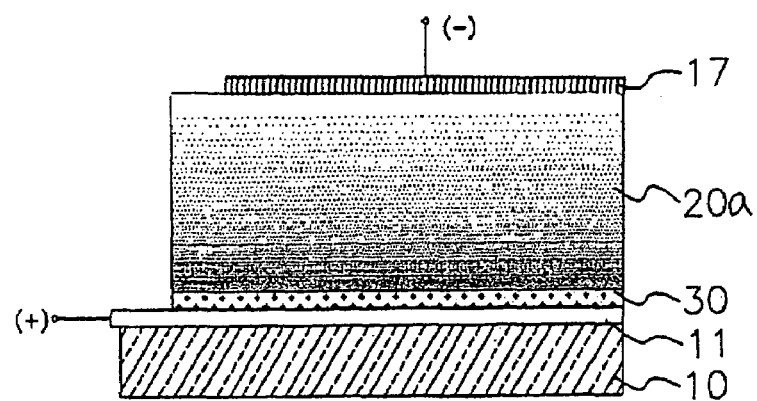
FIG. 3b is a structure diagram for illustrating the organic semiconductor device in accordance with another embodiment in view of another aspect of the present invention.
Figure 3C:
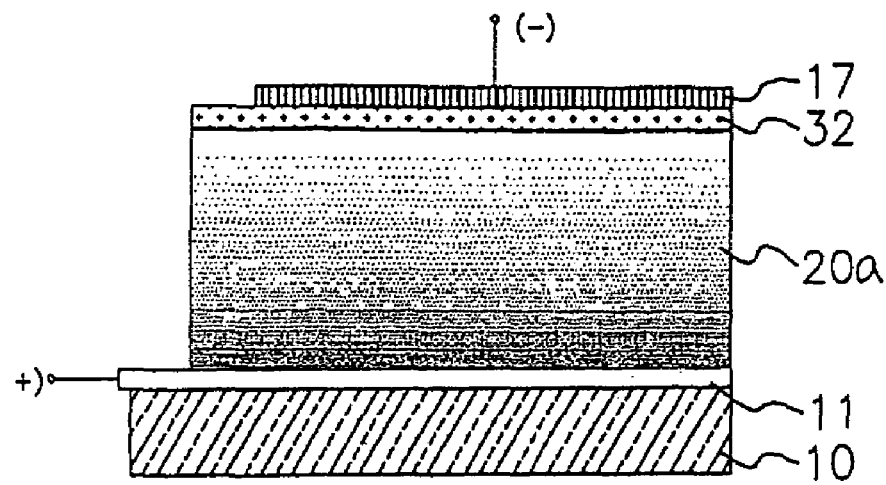
FIG. 3c is a structure diagram for illustrating the organic semiconductor device in accordance with still another embodiment in view of another aspect of the present invention.

Meanwhile, the organic EL device that ion distribution of salts is limited to the interface of the organic EL layer and electrodes, can be manufactured by forming the organic thin film 30 and/or 32 containing ionic salts at one or more sides of the organic EL layer 20a, which is descried in FIGS. 3a to 3c. Namely, FIG. 3a illustrates the organic semiconductor device having the organic thin films 30 and 32 formed on both sides of the EL layer 20, while FIG. 3b and FIG. 3c illustrate the organic semiconductor device having the organic thin film 30 formed on the electrode 11 and the organic thin film 32 formed under the electrode 17, respectively. In FIGS. 3a to 3c, the organic EL layer 20a may not contain ionic salts and may be manufactured by the conventional wet process or dry process. Also in similar to the organic EL layer 20 containing the ionic salts, the organic EL layer 20a includes at least two of a hole injecting layer, a hole transporting layer, a light-emitting layer, an electron transporting layer and an electron injecting layer, which is not shown in FIGS. 3a to 3c.

Referring to FIGS. 3a, 3b and 3c, since the organic thin film 30 and/or the organic thin film 32 including ionic salts between the EL layer 20 and the electrodes 11, 17 are formed, simultaneous treatment effect of thermal and electrical annealing can be obtained without the thermal and electrical annealing. The conductive resin or insulative resin doped with the ionic salt can be used as the organic thin film(s) 30 and/or 32, particularly the conductive resin doped with the ionic salt is more preferred because it can be utilized as the anode of the EL device. Exemplary conductive resins include polyaniline, poly(3-methylthiopene), polyphenylenesulfide, polypyrrole or PEDOT/PSS. The ionic salt included in the organic thin film(s) 30 and/or 32 can be the same ionic salt used in the preparation of the organic compound solution. The organic thin film(s) 30 and/or 32 can be formed by the conventional film forming process such as a wet process and a dry process. In case of forming the organic thin film(s) 30 and/or 32 containing the ionic salt, the amount of the ionic salt is 0.02 weight % to 30 weight % based on the total organic thin films 30 and 32. If the amount of the ionic salt is below 0.02 weight %, improvement of light-emitting efficiency and the reduction effect of the on-set voltage may be insufficient. If the amount of the ionic salt exceeds 30 weight %, the operation of devices may be deteriorated due to the excessive ion concentration.

While above-mentioned method has the disadvantage of the organic film forming process being added, above-mentioned method has the advantage of the thermal-annealing process and the electrical-annealing process being omitted. The preferable thickness of the organic thin films 30 and 32 is from 10 to 1000 nm, more preferably is 100 nm. If the thickness of the organic thin films 30 and 32 is away from the above-mentioned ranges, enhancement of light-emitting efficiency and the reduction effect of the on-set voltage may be insufficient.

In the process of manufacturing the organic light-emitting device, the ionic salts are further added to the thin film of high molecular weight resin or a drop ink in which light-emitting compounds, doping materials or charge transporting materials are distributed (see: T. R. Hebner and J. C. Sturma, Applied Physics Letters Vol 73, Num 13, p 1775, Korean Patent Publication No. 10-2001-7006372), and simultaneous treatments of thermal and electrical annealing the thin film is carried out. Accordingly, a method for manufacturing the organic semiconductor device according to the present invention has a simple manufacturing process and reduces the manufacturing cost of the semiconductor device, because the expensive equipment such as vacuum deposition equipment for organic thin film deposition is not required. The organic EL device manufactured according to the present invention has the maximal luminance of about 1000 cd/m2 (at ~17 V), and the bias applied voltage of electrical-annealing process is low. Thus, electrical damage of the device is prevented from electrical-annealing and the uniformity of the light-emitting surface can be enhanced.

The present invention provides the semiconductor device manufactured by the above-mentioned method and the light-emitting display device including the same. Therefore, the semiconductor device according to the present invention comprises ofH an anode, a cathode and a semiconductor layer containing the ionic salt, preferably organic semiconductor layer formed between the anode and the cathode. Wherein the interface of the anode and the semiconductor layer has the number of the anions of the ionic salt more than the number of the cations of the ionic salt and the interface of the cathode and the semiconductor layer has the number of the cations of the ionic salt more than the number of the anions of the ionic salt. The anions of the ionic salt at the interface of the anode and the semiconductor layer and the cations of the ionic salt at the interface of the cathode and the semiconductor layer are uniformly distributed over whole the light-emitting surface of the EL device. Alternatively, the semiconductor device according to the present invention includes an anode, a cathode, a semiconductor layer formed between the anode and the cathode and at least one organic thin film containing the ionic salt uniformly distributed wherein at least one organic thin film is formed at least one of between the anode and the semiconductor layer and between the cathode and the semiconductor layer. Here, the semiconductor device represents a single device or plurality of devices having a switching function and consisting of inorganic or organic semiconductor materials. The semiconductor device includes various conventional semiconductor devices, which are described in the background of the invention as well as the organic EL device. The light-emitting device represents an image display device using the semiconductor device such as the organic EL device. The light-emitting device includes the module which is obtained by attaching the connectors such as anisotropic conductive film, FPC (Flexible Printed Circuit; soluble print circuit), TAB (Tape Automated Bonding) tape, and TCP (Tape Carrier Package) to the semiconductor device, the module having the printed wiring board at the TAB tape or the end of TCP, the module that IC is mounted directly on the semiconductor by COG (Chip On Glass).

Although the present invention is described with reference to the device having one pixel, a plurality of pixels having the same structure can be aligned in a matrix type to form the device of the present invention, and the color EL display device can also be manufactured according to the present invention. In addition, the present invention also can be applied to the systems in which a white EL device and a color filter are combined, and a blue or bluish green EL device and a fluorescent materials (CCM, fluorescent color converting material layer) are combined. It is also applied to the color display device in which a transparent electrode is used as a cathode and an EL device corresponding to RGB is respectively laminated and a black and white display device in which a white light-emitting layer is formed. The organic semiconductor device according to the present invention can be applied to an active matrix EL light-emitting device which uses a thin film transistor as a switching device as well as a passive matrix EL light-emitting device because the organic semiconductor device includes the passive or active matrix electrode structure. The switching device includes not only a thin film transistor but also two-terminal device such as MIM. The semiconductor device can be driven by various method such as passive driving, static image driving, segment display driving. In addition, a single or plurality of switching devices can be formed on one pixel.

Hereinafter, the examples and comparative examples are provided for better understanding of the present invention. However, the present invention is not limited to the following examples.

EXAMPLE 1

Manufacturing the Organic EL Device Having the Single-Layered Thin Film Structure of Graded Junction Type Including the Organic Salts A glass substrate (0.7 mm) coated with Indium-Tin-Oxide (ITO) having 15Ω was ultrasonically washed in a commercially available cleaning agent, and then washed with deionized water. The organic compound solution was prepared by dissolving the organic materials in 6.0 g of mixture solution (chloroform:dichloroethane=1:3), wherein the organic materials include 6.5 mg of PVK (poly-N-vinylcarbazole) as the charge carrier binder resin, 6.5 mg of α-NPD as the hole transporting material, 6.5 mg of Alq3 as the green light-emitting and electron injecting material, 0.2 mg of C545T as the green light-emitting dopant and 0.5 mg of $Bu_4N-BF_4$ as the organic salts. The boiling point of chloroform and dichloroethane($ClCH_2CH_2Cl$) were 62° C. and 82° C. respectively. The organic compound solution was filtered through 0.2 μm Teflon filter. Thereafter, the organic compound solution was spin-coated on the ITO for 1 minute at the spinning speed of 1000 rpm. The coated organic layer was thermally treated at 80° C. for 30 minutes to completely evaporate the solvents. As a result, the EL layer of α-NPD~Alq3 (hole injecting, transporting layer~light-emitting layer) having the single-layered thin film structure of the graded junction type was formed, wherein the thickness of the EL layer was 50 to 70 nm. Al:Li cathode was deposited on the formed EL layer with the thickness of 200 nm, and then the EL device was encapsulated in a dry globe box in order to protect the EL device from the external environment. In the vacuum deposition process, the degree of vacuum was $5\times10^{-6}$ torr, the deposition speed was 1 nm/second, and the light-emission area of the organic EL device was 1×3 $mm^2$. The EL device was thermally annealed at 80° C. for 30 minutes and was electrically annealed by applying bias voltage of 9V to the anode and cathode of the EL device for 30 seconds simultaneously. And then, the EL device was cooled to room temperature to manufacture the final EL device. As shown in Table 1, the EL light-emitting initiation voltage (Von-set) of the EL device was about 3.5V, the current flowing through the EL device and the luminance at the voltage of 10V were 8.5 mA and about 3200 $cd/m^2$ respectively. The EL device emitted the stable and uniform green light (530 nm) at the voltage of 10V for a long time.

Comparative Example 1

Manufacturing the Standard EL Device without the Organic Salts

The standard EL device was manufactured in the same manner as described in Example 1, except for not doping the organic salts. The current flowing through the standard EL device and the luminance at 10V were 1.3 mA and about 38 $cd/m^2$ respectively. Thus, the EL device of Example 1 had the 84 times increased luminance at 10V in comparison with the standard EL device of Comparative Example 1.

Comparative Example 2

Manufacturing the EL Device without Thermal-Annealing

Except for carrying out electrical-annealing with 20V at room temperature instead of carrying out thermal-annealing and electrical-annealing simultaneously, the EL device was manufactured in the same manner as described in Example 1. As shown in Table 1, the EL light-emitting initiation voltage (Von-set) of the EL device was about 3.5V, the current flowing through the EL device and the luminance at the voltage of 10V were 4.4 mA and about 1000 $cd/m^2$ respectively. Although the EL device emitted green light (520 nm) with a comparatively high luminance, uniformity of the light-emitting surface was not good.

Figure 4:
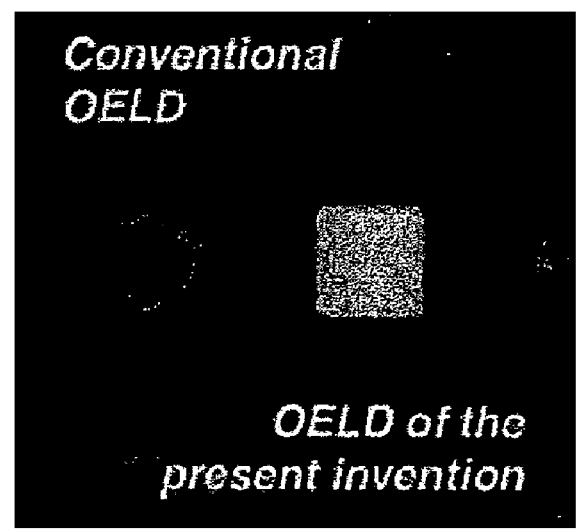
FIG. 4 is a picture for comparing the light-emitting surface of the organic EL device in accordance with one embodiment of the present invention and the light-emitting surface of the conventional organic EL device.

FIG. 4 is a picture for illustrating the light-emitting surface of the organic EL device in accordance with Example 1 and Comparative Example 2. The light-emitting surface (area: 3×3 $mm^2$) of the conventional organic EL device manufactured by Comparative Example 2 was illustrated at the left side of FIG. 4 and the light-emitting surface (area: 3×3 $mm^2$) of the organic EL device manufactured by Example 1 according to the present invention was illustrated at the right side of FIG. 4. From FIG. 4, the conventional organic EL device had uneven light-emitting surface and low light-emitting luminance in comparison with the organic EL device according to the present invention.

EXAMPLE 2

Manufacturing the Organic EL Device Having the Single-Layered Thin Film Structure of the Graded Junction Type Including the Inorganic Salts Except for using LiF inorganic salt instead of $Bu_4N-BF_4$ organic salt, the organic EL device was manufactured in the same manner as described in Example 1. As shown in Table 1, the EL light-emitting initiation voltage (Von-set) of the EL device was about 5V, the current flowing through the EL device and the light-emitting luminance at the voltage of 10V were 7.4 mA and about 114 $cd/m^2$ respectively. The EL device emitted the stable and uniform green light (520 nm) at the voltage of 10V for a long time. Thus, the EL device had the 3 times increased light-emitting luminance at 10V in comparison with the standard EL device of Comparative Example 1.

EXAMPLE 3

Manufacturing the Organic EL Device of the Uniformly Distributed Single-Layered Thin Film Structure Including the Organic Salts Except for using chloroform instead of the mixture solution of chloroform and dichloroethane, the EL device was manufactured in the same manner as described in Example 1. As shown in Table 1, the EL light-emitting on-set voltage (Von-set) of the EL device was about 5V, the current flowing through the EL device and the light-emitting luminance at the voltage of 10V were 2.5 mA and about 260 $cd/m^2$ respectively. The EL device emitted the stable and uniform green light at the voltage of 10V for a long time. Thus, the EL device had the 6.8 times increased light-emitting luminance at 10V in comparison with the standard EL device of Comparative Example 1.

EXAMPLE 4

Manufacturing the EL Device of the Uniformly Distributed Single-Layered Thin Film Structure Including the Organic Salt Except for using dichloroethane instead of the mixture solution of chloroform and dichloroethane, the EL device was manufactured in the same manner as described in Example 1. As shown in Table 1, the on-set voltage (Von-set) of the EL device was about 5V, the current flowing through the EL device and the light-emitting luminance at the voltage of 10V were 12 mA and about 45 cd/m$^2$ respectively. The EL device emitted the green light at the voltage of 10V. Thus, the EL device had the 1.2 times increased light-emitting luminance at 10V in comparison with the standard EL device of Comparative Example 1, but uniformity of the light-emitting surface was decreased comparatively. Therefore, it was known that the choice of solvent was important.

EXAMPLE 5

Manufacturing the EL Device Using PMMA Binder Resin

Except for using PMMA instead of PVK binder resin, the EL device was manufactured in the same manner as described in Example 1. As shown in Table 1, the on-set voltage (Von-set) of the EL device was about 4V, the current flowing through the EL device and the light-emitting luminance at the voltage of 10V were 1.6 mA and about 500 cd/m$^2$ respectively. The EL device emitted the stable and uniform green light at the voltage of 10V for a long time. Thus, the EL device had the 13 times increased light-emitting luminance at 10V in comparison with the standard EL device of Comparative Example 1.

EXAMPLE 6

Manufacturing the EL Device Using PPV Binder Resin

Except for using PPV instead of PVK binder resin, the EL device was manufactured in the same manner as described in Example 1. As shown in Table 1, the on-set voltage (Von-set) of the EL device was about 4V, the current flowing through the EL device and the light-emitting luminance at the voltage of 10V were 2.7 mA and about 307 cd/m$^2$ respectively. The EL device emitted the stable and uniform green light at the voltage of 10V for a long time. Thus, the EL device had the 8 times increased light-emitting luminance at 10V in comparison with the standard EL device of Comparative Example 1.

EXAMPLE 7

Manufacturing the EL Device Using the Binder Resin Mixture of PVK and PMMA

Except for using binder resin mixtures of PVK and PMMA (PVK:PMMA=3:1, weight ratio) instead of PVK binder resin, the EL device was manufactured in the same manner as described in Example 1. As shown in Table 1, the on-set voltage (Von-set) of the EL device was about 4V, the current flowing through the EL device and the light-emitting luminance at the voltage of 10V were 1.96 mA and about 760 cd/m$^2$ respectively. The EL device emitted the stable and uniform green light at the voltage of 10V for a long time. Thus, the EL device had the times increased light-emitting luminance at 10V in comparison with the standard EL device of Comparative Example 1.

EXAMPLE 8

Manufacturing the EL Device Using the Binder Resin Mixture of PVK and PPV

Except for using binder resin mixtures of PVK and PPV (PVK:PPV=3:1, weight ratio) instead of PVK binder resin, the EL device was manufactured in the same manner as described in Example 1. As shown in Table 1, the on-set voltage (Von-set) of the EL device was about 4V, the current flowing through the EL device and the light-emitting luminance at the voltage of 10V were 2.4 mA and about 693 cd/m$^2$ respectively. The EL device emitted the stable and uniform green light at the voltage of 10V for a long time. Thus, the EL device had the 18 times increased light-emitting luminance at 10V in comparison with the standard EL device of Comparative Example 1.

EXAMPLE 9

Manufacturing the EL Device Emitting Red Color

Except for using DCJTB instead of C545T as the light-emitting dopant, the EL device was manufactured in the same manner as described in Example 1. As shown in Table 1, the on-set voltage (Von-set) of the EL device was about 4V, the current flowing through the EL device and the light-emitting luminance at the voltage of 10V were 3.6 mA and about 213 cd/m$^2$ respectively. The EL device emitted the stable and uniform red light (585 nm) at the voltage of 10V for a long time.

EXAMPLE 10

Manufacturing the EL Device Emitting Blue Color

Except for using commercially available DPVBi and TBT instead of Alq3 and C545T, the EL device was manufactured in the same manner as described in Example 1. As shown in Table 1, the on-set voltage (Von-set) of the EL device was about 4V, the current flowing through the EL device and the light-emitting luminance at the voltage of 10V were 3.5 mA and about 66 cd/m$^2$ respectively. The EL device emitted the stable and uniform blue light (490 nm) at the voltage of 10V for a long time.

EXAMPLE 11

Manufacturing the EL Device Including Al Cathode

Except for using Al cathode instead of Al:Li cathode, the EL device was manufactured in the same manner as described in Example 1. As shown in Table 1, the on-set voltage (Von-set) of the EL device was about 5V, the current flowing through the EL device and the light-emitting luminance at the voltage of 10V were 2.3 mA and about 892 cd/m$^2$ respectively. The EL device emitted the stable and uniform green light (540 nm) at the voltage of 10V for a long time. Thus, the EL device had the 23 times increased light-emitting luminance at 10V in comparison with the standard EL device of Comparative Example 1.

EXAMPLE 12

Manufacturing the EL Device of the Phosphorescent Single-Layered Thin Film Structure Including the Organic Salts A glass substrate coated with Indium-Tin-Oxide(ITO) having 15Ω was washed. The organic compound solution was prepared by dissolving the organic materials in 5.0 g of mixture solution (chloroform:dichloroethane=1:3, mass ratio), wherein the organic materials includes 30 mg of PVK (poly-N-vinylcarbazole) as the charge carrier binder resin, 2.3 mg of TPD as the hole transporting material, 3 mg of $Ir(PPy)_3$ as the green light-emitting and phosphorescent material, 17 mg of oxidazole resin as the electron injecting material and 0.25 mg of $Bu_4N$—$BF_4$ as the organic salts. The organic compound solution was filtered through 0.2 μm Teflon filter. Thereafter, the organic compound solution was spin-coated on the ITO for 1 minute at the spinning speed of 1000 rpm to form the EL layer of the single thin film structure. Al cathode was deposited on the EL layer of the single thin film structure with the thickness of 150 nm and then the EL device was encapsulated in a dry globe box in order to protect the EL device from the external environment.

In the vacuum deposition process, the degree of vacuum was $5 \times 10^{-6}$ torr, the deposition speed was 1 nm/second, and the light-emitting area of the organic EL device was 3×3 $mm^2$. The EL device was treated thermally at 50° C. for 30 minutes and was treated electrically by applying bias voltage of 13V to the anode and the cathode of the EL device for 30 seconds simultaneously. And then, the EL device was cooled to room temperature to manufacture the final EL device. As shown in Table 1, the on-set voltage (Von-set) of the EL device was about 3.5V, the current flowing through the EL device and the light-emitting luminance at the voltage of 10V were 0.073 mA and about 98 $cd/m^2$ respectively. The EL device emitted the stable and uniform green light at the voltage of 10V for a long time.

Comparative Example 3

Manufacturing the Standard Phosphorescent EL Device without Thermal-Annealing

The standard EL device was manufactured in the same manner as described in Example 12, except for not carrying out thermal-annealing. The current flowing through the standard EL device and the light-emitting luminance at 10V were 0.043 mA and about 30 $cd/m^2$ respectively. Thus, the EL device of Example 12 had the 3 times increased light-emitting luminance at 10V in comparison with the standard EL device of Comparative Example 3.

EXAMPLE 13

Manufacturing the EL Device of the Phosphorescent Two-Layered Thin Film Structure Including the Organic Salt Before forming the light-emitting phosphorescent EL layer, the mixture solution (the conductive resin PEDOT solution including PSS resin salt (2.7 weight % solution, Aldrich):water=1:3 weight ratio) was spin-coated on the substrate coated ITO for 1 minute at the spinning speed of 3500 rpm, and was thermally treated at 150° C. for 2 hours. As a result, PEDOT/PSS thin film having the thickness of 100 nm was formed. The EL device of the two-layered thin film structure was manufactured by forming the light-emitting phosphorescent EL layer and the electrodes on the PEDOT/PSS thin film in the same manner as described in Example 12. The EL device was treated thermally at 50° C. for 30 minutes and was treated electrically by applying bias voltage of 13V to the anode and cathode of the EL device for 30 seconds simultaneously. And then, the EL device was cooled to room temperature to manufacture the final EL device. As shown in Table 1, the EL light-emitting initiation voltage (Von-set) of the EL device was about 4V, the current flowing through the EL device and the light-emitting luminance at the voltage of 10V were 0.033 mA and about 119 $cd/m^2$ respectively. The EL device emitted the stable and uniform green light (530 nm) at the voltage of 10V for a long time.

Comparative Example 4

Manufacturing the EL Device of the Phosphorescent Two-Layered Thin Film Structure without Thermal-Annealing The standard EL device was manufactured in the same manner as described in Example 13, except for not carrying out thermal-annealing. The current flowing through the standard EL device and the light-emitting luminance at 10V were 0.094 mA and about 0.99 $cd/m^2$ respectively. Thus, the EL device of Example 13 had the 120 times increased light-emitting luminance at 10V in comparison with the standard EL device of Comparative Example 4.

TABLE 1

| Type of thin film | | Von-set (V) | Luminance ($cd/m^2$) | Current (mA) |
|---|---|---|---|---|
| Example 1 | Graded junction | 3.5 | 3200 | 8.5 |
| Comparative Example 1 | Graded junction | — | 38 | 1.3 |
| Comparative Example 2 | Graded junction | 3.5 | 1000 | 4.4 |
| Example 2 | Graded junction | 5.0 | 114 | 7.4 |
| Example 3 | Uniformly distributed | 5.0 | 260 | 2.5 |
| Example 4 | Uniformly distributed | 5.0 | 45 | 12 |
| Example 5 | Graded junction | 4.0 | 500 | 1.6 |
| Example 6 | Graded junction | 4.0 | 307 | 2.7 |
| Example 7 | Graded junction | 4.0 | 760 | 2.0 |
| Example 8 | Graded junction | 4.0 | 693 | 2.4 |
| Example 9 | Graded junction | 4.0 | 213 | 3.6 |
| Example 10 | Graded junction | 4.0 | 66 | 3.5 |
| Example 11 | Graded junction | 5.0 | 892 | 2.3 |
| Example 12 | unknown | 3.5 | 98 | 0.073 |
| Comparative Example 3 | unknown | 8 | 30 | 0.043 |
| Example 13 | Stacked | 5.0 | 119 | 0.033 |
| Comparative Example 4 | Stacked | 10.0 | 0.99 | 0.094 |

From Examples 1 and 2, in case of carrying out thermal-annealing and electrical-annealing simultaneously the thin film of the PVK distribution graded junction type including ionic salts, light-emitting luminance of the EL device was enhanced and driving voltage was decreased. From Examples 3 and 4, it was known that the organic EL device of the uniformly distributed structure also had the same effects as those of Examples 1 and 2. Further, in case that the kinds of binder resins (Examples 5 to 8) and light-emitting color (Examples 9 and 10) are changed or cathode materials (Example 11) of high driving voltage was used owing to high work function, the same effects were produced. These effects can be observed in the EL device (Examples 12-13) having the phosphorescent thin film structure including the organic salt formed adjacent to the EL layer. Also, from the above-mentioned Examples and Table 1, the same effects can be applied to the stacked type EL device as well as the graded junction type EL device and uniformly distributed EL device.

As described, the organic semiconductor device according to the present invention has good characteristics such as uniformity of the light-emission, excellent luminescence and high light-emitting efficiency and has the low driving voltage, so that image quality and operation reliability of display with the present organic semiconductor device are improved. In addition, the organic semiconductor device according to the present invention can be easily manufactured with economically low costs. As shown in the above Examples, the organic semiconductor thin film according to the present invention has the excellent "Applied Voltage-Emitting Intensity" property and "Applied Voltage-Current" property, which are similar to non-linear current properties of a typical diode device. As a result, the organic semiconductor thin film according to the present invention can also be applied to various organic semiconductor devices such as organic diode devices.

The organic semiconductor device according to the present invention can be applied to various display devices, televisions, digital cameras, computers, notebook computers, mobile computers, portable image recording or displaying devices, screens, bulletin boards, store signs, goggle type displays, car displays, video cameras, printer displays, remote control devices, phone displays, mobile phones, etc. While the present invention has been shown and described with reference to certain preferred embodiments thereof, it will be understood by those skilled in the art that various changes in form and details may be made therein without departing from the spirit and scope of the invention as defined by the appended claims.

The invention claimed is:

1. A method for manufacturing an organic semiconductor device, comprising the steps of:
    forming a first electrode on a substrate;
    forming an organic semiconductor layer including an ionic salt by coating an organic compound solution on the first electrode and removing an organic solvent from the coated organic compound solution, wherein the organic compound solution includes the organic solvent, the ionic salt and organic semiconductor compounds;
    forming a second electrode having the opposite electric potential to the first electrode on the organic semiconductor layer including the ionic salt; and
    treating the organic semiconductor layer including the ionic salt with thermal annealing and electrical annealing simultaneously.

2. The method of claim 1, wherein the organic solvent is a single solvent.

3. The method of claim 1, wherein the organic solvent is the mixture of at least two solvents having different volatility and the organic semiconductor compounds comprise at least two organic compounds having different electrical and/or optical characteristics.

4. The method of claim 1, wherein the thermal-annealing temperature is lower than the glass transition temperature of the organic semiconductor compounds.

5. The method of claim 1, wherein the thermal-annealing temperature is 35 to 200° C.

6. The method of claim 1, wherein a bias voltage of the electrical-annealing is 3 to 20 volts.

7. The method of claim 1, wherein the ionic salt is selected from the group consisting of inorganic salt, organic salt, polymeric salt and the mixtures thereof.

8. The method of claim 7, wherein the inorganic salt is selected from the group consisting of $LiClO_4$, $LiPF_6$, $LiBF_4$, $LiN(CF_3SO_2)_2$, lithium trifluoromethane trisulfonate and the mixtures thereof.

9. The method of claim 7, wherein the organic salt is selected from the group consisting of tetra alkyl, aryl or hetero aryl quaternary ammonium salts and the mixtures thereof.

10. The method of claim 7, wherein the polymeric salt is polystyrenesulfonate(PSS).

11. The method of claim 1, wherein the organic solvent is selected from the group consisting of methyl alcohol, ethyl alcohol, n-propyl alcohol, isopropyl alcohol, n-butyl alcohol, sec-butyl alcohol, tert-butyl alcohol, dimethylformamide, dimethylacetamide, ketone, acetone, diacetone alcohol, ketoalcohol, dioxane, ether, polyethylene glycol, polypropylene glycol, polyalkylene glycol, ethylene glycol, propylene glycol, butylene glycol, triethylene glycol, hexylene glycol, diethylene glycol, glycerol, ethylene glycol monomethylether, diethyleneglycol methylether, triethyleneglycol monomethylether, 2-pyrrolidone, toluene, xylene, chlorobenzene, dichlorobenzene, chloroform, dichloromethane, dichloroethane, gamma-butyl lactone, butyl cellosolve, cyclohexane, NMP(N-methyl-2-pyrrolidonee), cyclohexanone, THF(tetrahydrofurane), carbon tetrachloride, tetrachloroethane, octylbenzene, dodecylbenzene, quinoline, trichlorobenzene, nitrobenzaldehyde, nitrobenzene, carbon disulfide, 2-heptanone, benzene, terpineol, butylcarbitolacetate, ion exchange water (pure water) and the mixtures thereof.

12. The method of claim 1, wherein the organic semiconductor compounds are selected from the group consisting of hole injection compounds, hole transportation compounds, luminescence/fluorescence (or phosphorescence) compounds, electron transportation compounds, electron injection compounds and the mixtures thereof.

13. The method of claim 1, wherein the organic compound solution further includes a binder resin and/or dopant.

14. The method of claim 13, wherein the binder resin is insulative or conductive resin.

15. The method of claim 13, wherein the binder resin is selected from the group consisting of Poly(phenylene-vinylene)(PPV), poly-N-vinylcarbazole(PVK), polymethylmethacrylate(PMMA), polyfluorene, polycarbonate, polyester, polyallylate, butyral resins, polyvinylacetal, diallyphthalate resins, acrylic resins, methacrylic resins, phenol resins, epoxy resins, silicone resins, polysulfone resins, urea resins and their derivatives.

16. The method of claim 1, wherein the concentration of the organic compound solution is 0.005 to 30 weight %.

17. The method of claim 1, wherein the viscosity of the organic compound solution is less than 5000 cp.

18. The method of claim 1, wherein the organic compound solution is applied on the substrate by the wet process which is selected from the group consisting of spin-coating method, cast method, inkjet method, dipping method and printing method.

* * * * *